United States Patent [19]

Takahashi et al.

[11] Patent Number: 5,027,169
[45] Date of Patent: Jun. 25, 1991

[54] SEMICONDUCTOR DEVICE WITH SUBSTRATE MISORIENTATION

[75] Inventors: Kosei Takahashi, Nara; Masahiro Hosoda, Kitakatsuragi; Atsuo Tsunoda, Yamatokoriyama; Masafumi Kondo, Nara; Takahiro Suyama, Tenri, all of Japan

[73] Assignee: Sharp Kabushiki Kaisha, Japan

[21] Appl. No.: 531,386

[22] Filed: Jun. 1, 1990

[30] Foreign Application Priority Data

Jun. 7, 1989 [JP] Japan .................. 1-145620

[51] Int. Cl.$^5$ ............................................. H01L 33/00
[52] U.S. Cl. ........................................... 357/17; 357/4; 357/16; 357/60
[58] Field of Search ..................... 357/4, 16, 60, 17

[56] References Cited

U.S. PATENT DOCUMENTS

| | | | |
|---|---|---|---|
| 3,476,592 | 11/1969 | Berkenblit et al. | 117/201 |
| 4,894,836 | 1/1990 | Hayakawa et al. | 372/45 |
| 4,939,557 | 7/1990 | Pao et al. | 357/60 X |

FOREIGN PATENT DOCUMENTS 2202371A 9/1988 United Kingdom .

OTHER PUBLICATIONS

Ikeda et al., "GaInP/A/GaInP Double-Heterostructure Laser Grown on a (111)B-Oriented GaAs Substrate by Metalorganic Chemical Vapour Deposition," *Electronics Letters*, 18 Aug. 1988, vol. 24, No. 17, pp. 1094-1095.

Hayakawa et al., "Near-Ideal Low Threshold Behavior in (111) Oriented GaAs/A/GaAs Quantum Well Lasers", *Appl. Phys. Lett.* 52(5), Feb. 1, 1988, pp. 339-341.

Hayakawa et al., "Enhancement in Optical Transition in (111)-Oriented GaAs-A/GaAs Quantum Well Structures," *Physical Review Letters*, 25 Jan. 1988, vol. 60, No. 4, pp. 349-352.

Hayakawa et al., "High Reliability in AlGaAs Laser Diodes Prepared by Molecular Beam Epitaxy on 0.5°-Misoriented (111) B Substrates," *Japanese Journal of Applied Physics*, vol. 27, No. 5, May 1988, pp. 2889-2891.

Takahashi et al., "MBE Growth and Properties of (100)- and (111)-Oriented GaInP/AlInP Quantum Wells on GaAs Substrates", *Journal of Crystal Growth*, 95 (Feb. 1989), pp. 333-337.

Hayakawa et al., "Reduction in Threshold Current Density of Quantum Well Lasers Grown by Molecular Beam Epitaxy on 0.5° Misoriented (111) B Substrates," *Japanese Journal of Applied Physics*, vol. 26, No. 4, Apr. 1987, pp. L302-L305.

Ueda, "Atomic Structure of Ordered InGaP Crystals Grown on (001) GaAs Substrates by Metalorganic Chemical Vapor Deposition," *Japanese Journal of Applied Physics*, vol. 26, No. 11, Nov. 1987, pp. L1824-L1827.

Blakeslee, "Growth of Dislocation-Free GaAs Epitaxial Layers", *IBM Technical Disclosure Bulletin*, vol. 16, No. 7, Dec. '73, p. 2230.

Rode, "Crystal Growth Terraces and Surface Reconstruction", *Journal of Crystal Growth*, 27 (1974), 313-315.

Vina et al., "AlGaAs (111) Heterostructures Grown by Molecular Beam Epitaxy"-Appl. Phys. Lett. 48(1), 6 Jan. 1986, pp. 36-37.

Tsui et al.-"$Al_{0.3}Ga_{0.7}$As/GaAs Single Quantum Well Structures Grown by Molecular Beam Epitaxy on Misoriented Substrates"-Appl. Phys. Lett. 48(14), 7 Apr. 1986.

Tsui et al.-"Properties of $Al_xGa_{1-x}As(x_{Al}\delta 0.3)$ Grown by Molecular Beam Epitaxy on Misoriented Sub- (List continued on next page.)

Primary Examiner—William Mintel
Attorney, Agent, or Firm—Nixon & Vanderhye

[57] ABSTRACT

A semiconductor device comprising a (111)B single-crystalline semiconductor substrate which is misoriented toward (110), and epitaxial layers grown on the substrate by molecular beam epitaxy, whereby the crystallinity and luminescence efficiency of epitaxial layers are significantly improved.

3 Claims, 2 Drawing Sheets

OTHER PUBLICATIONS strates"-J. Appl. Beam Epitaxy Phys. 59(5), 1 Mar. 1986, pp. 1506–1512.

Tsui et al.-"Effects of Substrate Misorientation on the Properties of (Al,Ga) As Grown by Molecular Beam Eptiaxy"-J. Appl. Phys. 58(7), 1 Oct. 1985, pp. 2570–2572.

W. T. Tsang, App. Phys. letters, vol. 39, vol. 10, pp. 786–788 11/15/81, Extremely Low Threshold (AlGa) As Modified Multiquantum Well Heterostructure Lasers Grown by Molecular-Beam Epitaxy.

N. K. Dutta, J. Appl. Phys. 53(11), 11/82, pp. 7211–7214, Calculated Threshold Current of GaAs Quantum Well Lasers.

H. Iwamura et al., Elect. Letters, 3/3/83, pp. 180–181, Dynamic Behaviour of a GaAs-AlGaAs MQW Laser Diode.

T. Mimura et al., Japanese Journal of Applied Physics, vol. 19, No. 5, pp. L225–L227, May 1980, A New Field Effect Transistor with Selectively Doped GaAs/n-$Al_x$-$Ga_{l-x}$As Heterojunctions.

T. Hayakawa et al., Japanese Journal of Applied Physics, vol. 27, No. 8, pp. L1553–L1555, 8/88, GaInP-/AlInP Quantum Well Structures and Double Heterostructure Lasers Grown by Molecular Beam Epitaxy on (100) GaAs.

A. Gomyo, Appl. Phys. Lett. 50(11), 16 Mar. 1987, pp. 673–675, Evidence for the Existence of an Ordered State in $Ga_{0.5}In_{0.5}P$ Grown by Metalorganic Vapor Phase Epitaxy and Its Relation to Band-Gap Energy.

SEMICONDUCTOR DEVICE WITH SUBSTRATE MISORIENTATION

BACKGROUND OF THE INVENTION

1. Field of the Invention

The present invention relates to a semiconductor device, and more particularly to a semiconductor device comprising high-quality epitaxial layers which are grown on a single-crystal semiconductor substrate by molecular beam epitaxy (hereinafter abbreviated as MBE).

2. Description of the Prior Art

In recent years, the MBE growth technique has been remarkably developed, so that it is possible to control the formation of extremely thin epitaxial layers having a thickness of approximately 10 Å or less that is the order of a monolayer thickness. This progress in the MBE growth technique has realized the manufacture of novel semiconductor devices utilizing a new effect based on a device structure having extremely thin layers, which could not be manufactured by conventional growth techniques such as liquid phase epitaxy (hereinafter abbreviated as LPE) or the like.

A typical example of such semiconductor devices is a GaAs/AlGaAs quantum well (QW) laser. In this GaAs/AlGaAs QW laser, an active layer has a thickness of about 100 Å or less, resulting in the formation of quantum levels therein, while the active layer of the conventional double-heterostructure (DH) laser has a thickness of several hundreds of angstroms or more. This GaAs/AlGaAs QW laser is advantageous over the conventional DH laser in that it can attain a lower threshold current, good temperature characteristics, and excellent transient characteristics (see, for example, W.T. Tsang, Applied Physics Letters, Vol. 39, No. 10, pp. 786, 1981; N.K. Dutta, Journal of Applied Physics, Vol. 53, No. 11, pp. 7211, 1982; and H. Iwamura, T. Saku, T. Ishibashi, K. Otsuka, Y. Horikoshi, Electronics Letters, Vol. 19, No. 5, pp. 180, 1983).

Another typical example of the semiconductor device produced by MBE is a field effect transistor (FET) utilizing the high mobility characteristics of two-dimensional electron gas generated at an interface between GaAs layer and AlGaAs layer (see, T. Mimura et al., Japanese Journal Applied Physics, Vol. 19, p. L225, 1980).

By the use of the MBE growth technique, it is easy to produce semiconductor devices having novel compound semiconductor materials which cannot be grown by the conventional techniques such as LPE or the like. A typical example of such materials is AlGaInP which is used as a semiconductor crystal for a visible-light emitting semiconductor laser device. The MBE growth technique has realized the excellent crystal growth of AlGaInP, which was difficult to do by LPE or other conventional techniques. The semiconductor device obtained by growing the AlGaInP crystal by MBE can attain continuous laser oscillation with a wavelength of 670 nm at room temperature (see, for example, T. Hayakawa, Japanese Journal Applied Physics, Vol. 27, pp. L1553, 1988).

Such semiconductor materials that are difficult to grow on the semiconductor substrate without using MBE include, other than the above-mentioned AlGaInP, AlGaInAs used in a light-emitting communication device having a long oscillation wavelength of a 1.3 to 1.5 μm band, or the like. Furthermore, a smooth heterointerface of the grown layers can be obtained by using the MBE growth technique.

Therefore, MBE allows the semiconductor devices utilizing quantum effects such as the QW lasers, HEMTs (high electron mobility transistors), or the like to be manufactured with ease.

In general, the above-discussed semiconductor devices have been formed on a (100)-oriented GaAs substrate. In an AlGaInP crystal which was grown on the (100)-oriented GaAs substrate by metalorganic chemical vapor deposition (MOCVD) or MBE, a bandgap of the resulting AlGaInP crystal layer was smaller than that expected from the conventional theories and experiments. This is because the group III atoms such as Al, Ga and In were not arranged at random in the AlGaInP crystal layer, but arranged to form a natural superlattice in the AlGaInP crystal (see, for example, A. Gomyo, Applied Physics Letters, Vol. 50, pp. 673, 1987; and O. Ueda, Japanese journal Applied Physics, Vol. 26, L.1824, 1987).

Actually, due to the formation of the natural superlattice, the oscillation wavelength of the semiconductor laser device with a GaInP active layer, although it was expected to be 650 nm, was as long as 670 nm.

On the contrary, when the above-mentioned AlGaInP crystal was grown on a (111)-oriented GaAs substrate, the oscillation wavelength of the resulting semiconductor laser device was not longer than that expected from the conventional theories and experiments.

Therefore, studies on semiconductor devices comprising the (111)-oriented GaAs substrates have become extensive rather than on semiconductor devices with the (100)-oriented GaAs substrates (see, for example, S. Yasuami, Applied Physics Letters; and M. Ikeda, ELECTRONICS LETTERS, Vol. 24, pp. 1094, 1988).

Also, it is disclosed by Hayakawa et al., that two-dimensional carrier confining effects (quantum size effects) which are generated when using extremely thin layers occurred more strongly in the semiconductor devices with the (111)-oriented GaAs substrates than in the semiconductor devices with the (100)-oriented GaAs substrates (see, for example, T. Hayakawa, Applied Physics Letters, Vol. 52, p. 339, 1988; and T. Hayakawa, Phys. Rev. B Vol. 60, p. 349, 1988).

Furthermore, it is disclosed that the reliability of the semiconductor laser devices formed on the (111)-oriented GaAs substrates by MBE is superior to that of the semiconductor laser devices formed on the (100)-oriented GaAs substrates by MBE (see, for example, T. Hayakawa, Japanese Journal Applied Physics, Vol. 27, p. L889, 1988).

In this way, in recent years, the semiconductor devices having crystal layers grown on the (111)-oriented GaAs substrates have been developed.

However, the above-discussed semiconductor device formed on the (111)-oriented substrate has a problem such that the crystal quality of the crystal layers grown on the (111)-oriented substrate is poor. For example, $(Al_xGa_{1-x})_{0.5}In_{0.5}P$ (x=0.1 to 1.0) layers were grown by MBE on the (001)-oriented GaAs substrate and the (111)B-oriented GaAs substrate, and the crystal quality of grown layers were respectively evaluated. As a result, on the (001)-oriented GaAs substrate, a high-quality epitaxial layer having a perfectly smooth surface like a mirror surface was obtained, whereas an epitaxial layer grown on the (111)B-oriented GaAs substrate exhibited a hazy and rough surface, which has poor crystal quality.

Even though the semiconductor laser devices comprise a the (111)-oriented substrate, the semiconductor laser device in which the layers have poor crystal quality cannot stably and continuously emit a laser beam of light with a short wavelength at a low threshold current at room temperature.

SUMMARY OF THE INVENTION

The semiconductor device of the present invention, which overcomes the above-discussed and numerous other disadvantages and deficiencies of the prior art, comprises a (111)B single-crystal semiconductor substrate that is misoriented toward (110) and epitaxial layers that are grown on said substrate by molecular beam epitaxy.

In a preferred embodiment, the misorientation angle of said substrate is 2.5°–4.0°.

In a preferred embodiment, the single crystal semiconductor substrate is made of a material selected from the group consisting of GaAs, GaSb, InAs, InP, GaP, and InSb.

In a preferred embodiment, the epitaxial layers are made of the group III-V compound semiconductors.

Thus, the invention described herein makes possible the objectives of (1) providing a semiconductor device in which the crystallinity and luminescence efficiency of epitaxial layers are significantly improved; and (2) providing a semiconductor device which can stably and continuously emit a laser beam of light with a short wavelength at a low threshold current at room temperature.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
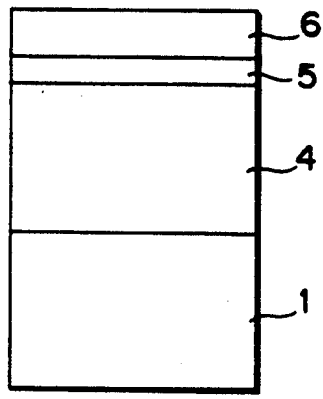
FIG. 1 is a sectional view showing a semiconductor device of the present invention having a quantum well structure.

Referring to the drawings, embodiments of the present invention will be described below.

EXAMPLE 1

FIG. 1 shows a semiconductor device of the present invention having a quantum well structure, which was produced as follows: On a (111)B GaAs substrate 1 which is 2.5°–4.0° misoriented toward (110), an $Al_{0.5}In_{0.5}P$ layer (the thickness thereof being 1 μm) 4, a $Ga_{0.5}In_{0.5}P$ quantum well layer (the thickness thereof being 80Å) 5, and an $Al_{0.5}In_{0.5}P$ layer 6 are successively grown by MBE. These grown layers exhibited an excellent surface morphology. Then, the quantum well layer 5 was excited by 514.5 nm light from an Ar laser, and the intensity of photoluminescence emitted from the quantum well layer 5 was measured at room temperature. This device showed a luminescence efficiency higher than the conventional semiconductor devices by more than one order of magnitude. This enhancement of the photoluminescence intensity and the luminescence efficiency demonstrates that the crystal layers grown by MBE on the (111)B substrate which is 2.5°–4.0° misoriented toward (110) has significantly excellent crystal quality.

As comparative examples, semiconductor devices were produced on substrates in which the misorientation angle from (111)B toward (110) is not in the range of 2.5°–4.0°. These semiconductor devices exhibited poor surface morphology and lower luminescence efficiency just like the conventional semiconductor devices.

As another comparative example, a semiconductor device was produced on a (111)B substrate which was misoriented toward (100). Although the crystal quality of crystal layers of this semiconductor device was improved to a certain degree as compared with the conventional semiconductor devices, the improvement of the device characteristics such as the enhancement in luminescence efficiency observed in the semiconductor device of this invention in Example 1 could not be attained.

The above-mentioned example discloses only GaAs/GaInP semiconductor devices. However, since the optimum conditions of the misorientation angle of the substrate are based on the growth mechanism of the group III-V compound semiconductors by MBE, the semiconductor devices with substrates made of GaSb, InAs, InP, GaP, InSb or the like can also obtain the same effects as the above-mentioned.

Also, in a two-dimensional electron gas field effect transistor comprising the (111)B substrate which is 2.5°–4.0° misoriented toward (110) and epitaxial layers grown on the substrate by MBE, the one-dimensional quantization along the [111] axis strongly occurs and improves the device characteristics of the two-dimensional electron gas field effect transistor.

EXAMPLE 2

Figure 2:
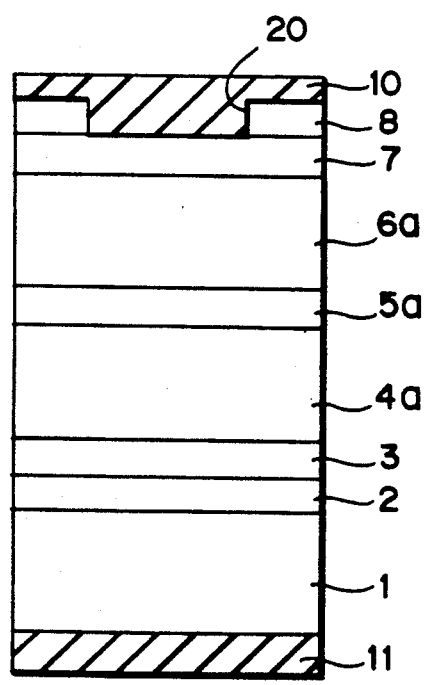
FIG. 2 is a sectional view showing a semiconductor device of the present invention having a double-heterostructure.

FIG. 2 shows another semiconductor laser device of the present invention having a double-heterostructure, which was produced as follows: On a (111)B n-GaAs substrate 1 (doped with $Si=10^{10}cm^{-3}$) which is 3° misoriented toward (110), an n-GaAs buffer layer (the thickness thereof being 0.5 μm) 2, an $n-Ga_{0.5}In_{0.5}P$ buffer layer (the thickness thereof being 0.5 μm) 3, an $n-(Al_{0.7}Ga_{0.3})_{0.5}In_{0.5}P$ cladding layer (the thickness thereof being 1 μm) 4a, an undoped $Ga_{0.5}In_{0.5}P$ active layer (the thickness thereof being 0.08 μm) 5a, a $p-(Al_{0.7}Ga_{0.3})_{0.5}In_{0.5}P$ cladding layer (the thickness thereof being 0.8 μm) 6a, and a $p-Ga_{0.5}In_{0.5}P$ cap layer (the thickness thereof being 0.5 μm) 7 were successively grown by MBE. After the growth of these crystal layers, a $SiN_x$ current blocking layer 8 was formed on the cap layer 7 by plasma chemical vapor deposition (plasma CVD). Next, the central portion of the current blocking layer 8 was removed by an etching technique using a buffered HF (BHF) etchant, resulting in a striped channel 20 having a width of 10 μm through which current flows. Then, an AuGe-Ni layer 11 was disposed on the back face of the n-GaAs substrate 1 by a vapor deposition and alloying to form a n-sided ohmic electrode. On the upper face of the cap layer 7 including the current blocking layer 8, an AuZn layer 10 was disposed by a vapor deposition and alloying to form a p-sided ohmic electrode.

The resulting semiconductor laser device, when it had a cavity length of 250 μm, stably emitted a laser beam of light with a wavelength of 655 nm at room temperature at a threshold current of 90 mA.

A semiconductor laser device having the same construction as the above-mentioned example on a conventional (100) n-GaAs substrate was produced as a comparative example. This semiconductor device attained continuous laser oscillation at a threshold current of 90 mA at room temperature, but the oscillation wavelength thereof was as long as 670 nm.

As another comparative example, a semiconductor device having the same construction of this embodiment on the (111) n-GaAs substrate having no misorientation angle was produced. This semiconductor device attained laser oscillation at a wavelength of 655 nm at room temperature, but the threshold current was as high as 200 mA that continuous laser oscillation could not be achieved.

EXAMPLE 3

Figure 3:
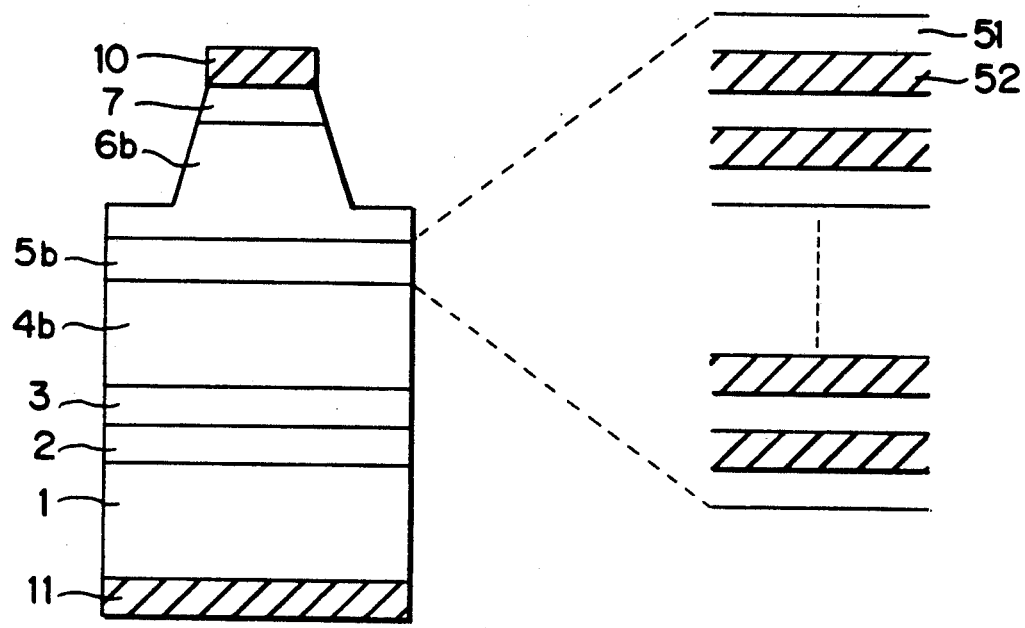
FIG. 3 is a sectional view showing a semiconductor device of the present invention having a multiple quantum-well structure.

FIG. 3 shows still another semiconductor laser device of the present invention having a multiple quantum-well (MQW) structure, which was produced as follows: On a (111)B n-GaAs substrate 1 which is 3° misoriented toward (110), an n-GaAs buffer layer (the thickness thereof being 0.5 μm) 2, an n-Ga$_{0.5}$In$_{0.5}$P buffer layer (the thickness thereof being 0.5 μm) 3, an n-(Al$_{0.7}$Ga$_{0.3}$)$_{0.5}$In$_{0.5}$P cladding layer (the thickness thereof being 1 μm) 4b, an undoped multiple quantum-well active layer 5b, a p-(Al$_{0.7}$Ga$_{0.3}$)$_{0.5}$In$_{0.5}$P cladding layer (the thickness thereof being 0.8 μm) 6b, and a p-Ga$_{0.5}$In$_{0.5}$P cap layer (the thickness thereof being 0.5 μm) 7 were successively grown by MBE. The active layer 5b, which is shown on an enlarged scale at the right-hand side in FIG. 3, was formed by alternatively layering eight undoped Ga$_{0.5}$In$_{0.5}$P quantum-well layers (the thickness of each layer being 35 Å) 51 and seven undoped [(Al$_{0.5}$Ga$_{0.5}$)$_{0.5}$In$_{0.5}$P] barrier layers (the thickness of each layer being 40 Å) 52. Thereafter, the prescribed portion of both the cap layer 7 and the p-cladding layer 6b were etched by a chemical etching technique using a sulfuric acid-containing etchant, without removing both side ends of the p-cladding layer 6b with a thickness of 0.3 μm, resulting in a ridge structure having a width of 5 μm. Then, an AuGe-Ni layer 11 was disposed on the back surface of the substrate 1 by a vapor deposition and alloying to form an n-sided ohmic electrode. On the upper face of the cap layer 7, an AuZn layer 10 was disposed by a vapor deposition and alloying to form a p-sided ohmic electrode.

The resulting semiconductor laser, when it had a cavity length of 250 μm, stably emitted a laser beam of light with a wavelength of 640 nm at room temperature at a threshold current of 40 mA.

As a comparative example, a semiconductor device having the same construction as the above-mentioned example on a conventional (100) n-GaAs substrate was produced. This semiconductor device emitted a laser beam of light with a wavelength of 650 nm at a threshold current of 45 mA.

By optimizing the misorientation angle of the (111) substrate as mentioned above, the (111)-oriented quantum well laser having excellent crystal quality was obtained which can attain laser oscillation with a shorter wavelength at a lower threshold current as compared with the conventional (100)-oriented quantum well lasers.

EXAMPLE 4

Figure 4:
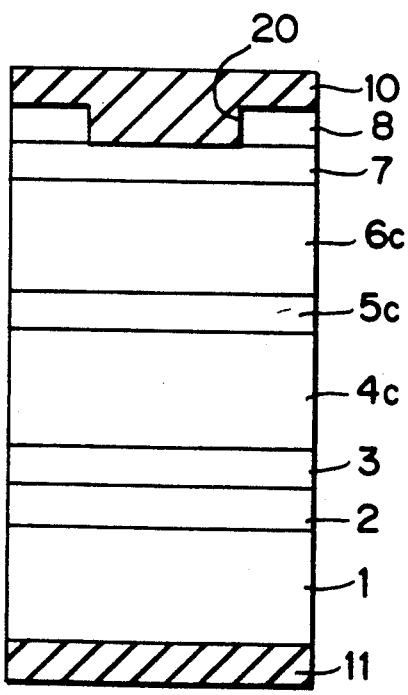
FIG. 4 is a sectional view showing another semiconductor device of the present invention having a double-heterostructure.

FIG. 4 shows still another semiconductor laser device of the present invention, which has a double-heterostructure with an (Al$_{0.1}$Ga$_{0.9}$)$_{0.5}$In$_{0.5}$P active layer.

The semiconductor laser device of the present embodiment was produced as follows: On a (111)B n-GaAs substrate 1 which is 3° misoriented toward (110), an n-GaAs buffer layer (the thickness thereof being 0.5 μm) 2, an n-Ga$_{0.5}$In$_{0.5}$P buffer layer (the thickness thereof being 0.5 μm) 3, an n-Al$_{0.5}$In$_{0.5}$P cladding layer (the thickness thereof being 1 μm) 4c, an undoped (Al$_{0.1}$Ga$_{0.9}$)$_{0.5}$In$_{0.5}$P active layer (the thickness thereof being 0.08 μm) 5c, a p-Al$_{0.5}$In$_{0.5}$P cladding layer (the thickness thereof being 0.8 μm) 6c, and a p-In$_{0.5}$Ga$_{0.5}$P cap layer (the thickness thereof being 0.5 μm) 7 were successively grown by MBE, after which a SiNx current blocking layer 8 was formed on the cap layer 7 by plasma CVD. The center portion of the current blocking layer 8 is then removed by an etching technique using a BHF etchant, resulting in a striped channel 20 having a width of 10 μm within which current is confined. Next, an AuGe-Ni layer 11 was disposed on the back face of the n-GaAs substrate 1 by a vapor deposition and alloying to form an n-sided ohmic electrode. On the cap layer 7 including the current blocking layer 8, an AuZn layer 10 was disposed by a vapor deposition and alloying to form a p-sided ohmic electrode.

The resulting semiconductor laser, when it had a cavity length of 250 μm, stably emitted a laser beam of light with a wavelength of 630 nm at a threshold current of 95 mA at room temperature.

As a comparative example, a semiconductor device having the same construction as the above-mentioned example on the conventional (100) n-GaAs substrate was produced. This semiconductor device also attained continuous oscillation at room temperature at a threshold current of 90 mA, but the oscillation wavelength was as long as 650 nm.

As discussed above, by optimizing the misorientation angle of the (111) substrate, the crystal quality of the grown layers was improved, and the semiconductor devices were obtained which can attain stable laser oscillation at room temperature with a shorter oscillation wavelength although the grown layers of the semiconductor devices have the same composition as the conventional ones.

According to the present invention, the semiconductor device of the present invention comprises a (111)B single-crystalline substrate misoriented toward (110) and crystal layers grown on the substrate by MBE, so that the crystallinity and the luminescence efficiency of the crystal layers are significantly improved. Moreover, a natural superlattice is not formed in the active layer so that the oscillation wavelength of the semiconductor device can be shortened.

Furthermore, the semiconductor device of the present invention, particularly when the crystal layers thereof are made of the group III-V compound semiconductors containing Al and In, has excellent crystal quality, thereby attaining stable laser oscillation at a shorter wavelength and at a lower threshold current as compared with the conventional semiconductor devices.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor device comprising a (111)B single-crystal semiconductor substrate that is misoriented toward (110) and epitaxial layers that are grown on said substrate by molecular beam epitaxy; wherein the misorientation angle of said substrate is within the range of 2.5° to 4.0°.

2. A semiconductor device according to claim 1, wherein said single crystal semiconductor substrate is made of a material selected from the group consisting of GaAs, GaSb, InAs, InP, GaP, and InSb.

3. A semiconductor device according to claim 1, wherein said epitaxial layers are made of the group III-V compound semiconductors.

* * * * *